United States Patent
Li et al.

(10) Patent No.: US 11,003,298 B2
(45) Date of Patent: May 11, 2021

(54) TOUCH MODULE, TOUCH DISPLAY SUBSTRATE AND TOUCH DISPLAY DEVICE

(71) Applicant: BOE TECHNOLOGY GROUP CO., LTD., Beijing (CN)

(72) Inventors: Yuanyuan Li, Beijing (CN); Meizhu Zheng, Beijing (CN); Junjie Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/639,033

(22) PCT Filed: Jul. 17, 2019

(86) PCT No.: PCT/CN2019/096308
§ 371 (c)(1),
(2) Date: Feb. 13, 2020

(87) PCT Pub. No.: WO2020/020027
PCT Pub. Date: Jan. 30, 2020

(65) Prior Publication Data
US 2020/0183538 A1    Jun. 11, 2020

(30) Foreign Application Priority Data
Jul. 25, 2018    (CN) .......................... 201810825645.7

(51) Int. Cl.
*G06F 3/041* (2006.01)
*G06F 3/044* (2006.01)
(Continued)

(52) U.S. Cl.
CPC ........ *G06F 3/0446* (2019.05); *G02F 1/13338* (2013.01); *G06F 3/0412* (2013.01);
(Continued)

(58) Field of Classification Search
None
See application file for complete search history.

(56) References Cited

U.S. PATENT DOCUMENTS

| 2010/0265206 A1* | 10/2010 | Chen ....................... G06F 3/044 |
| | | 345/174 |
| 2011/0007030 A1* | 1/2011 | Mo .......................... G06F 3/044 |
| | | 345/174 |

(Continued)

FOREIGN PATENT DOCUMENTS

| CN | 101424817 A | 5/2009 |
| CN | 101943975 A | 1/2011 |

(Continued)

OTHER PUBLICATIONS

First Chinese Office Action dated May 26, 2020, for corresponding Chinese Application No. 201810825645.7.
(Continued)

*Primary Examiner* — Roy P Rabindranath
(74) *Attorney, Agent, or Firm* — Kinney & Lange, P.A.

(57) ABSTRACT

A touch module, touch display substrate and touch display device are provided. The touch module includes: a base substrate, and a conductive grid layer and a bridging pattern disposed on the base substrate; the conductive grid layer covers an entire touch area on the base substrate. The conductive grid layer includes a plurality of first touch electrodes and a plurality of second touch electrodes, the first touch electrodes and the second touch electrodes are arranged crosswise and insulated from each other, each of the first touch electrodes includes a plurality of connected first sub-electrodes, and each of the second touch electrodes includes a plurality of independent second sub-electrodes; the bridging pattern and the conductive grid layer are arranged in different layers; and adjacent second sub-elec- (Continued)

trodes belonging to the same second touch electrode are connected through the bridging pattern.

19 Claims, 12 Drawing Sheets

(51) Int. Cl.
    *G02F 1/1333*      (2006.01)
    *H01L 27/32*      (2006.01)

(52) U.S. Cl.
    CPC .......... *G06F 3/0443* (2019.05); *H01L 27/323* (2013.01); *G06F 2203/04111* (2013.01)

(56) References Cited

U.S. PATENT DOCUMENTS

| | | | |
|---|---|---|---|
| 2014/0160373 A1 | 6/2014 | Hsu et al. | |
| 2015/0009427 A1* | 1/2015 | Chen .................. | G06F 3/044 349/12 |
| 2017/0108975 A1 | 4/2017 | Zhang et al. | |
| 2018/0173346 A1 | 6/2018 | Du et al. | |

FOREIGN PATENT DOCUMENTS

| | | |
|---|---|---|
| CN | 103336382 A | 10/2013 |
| CN | 103425324 A | 10/2013 |
| CN | 103870075 A | 6/2014 |
| CN | 104391604 A | 3/2015 |
| CN | 104793833 B | 11/2017 |
| CN | 107656646 A | 2/2018 |
| CN | 207281735 U | 4/2018 |
| JP | 2015210758 A | 11/2015 |

OTHER PUBLICATIONS

International Search Report and Written Opinion dated Oct. 18, 2019, for corresponding PCT Application No. PCT/CN2019/096308.

Second Chinese Office Action dated Nov. 27, 2020, received for corresponding Chinese Application No. 201810825645.7, 18 pages.

\* cited by examiner

TOUCH MODULE, TOUCH DISPLAY SUBSTRATE AND TOUCH DISPLAY DEVICE

CROSS-REFERENCE TO RELATED APPLICATION

The present application is a U.S. national phase application of a PCT Application No. PCT/CN2019/096308 filed on Jul. 17, 2019, which claims a priority to Chinese Patent Application No. 201810825645.7 filed in China on Jul. 25, 2018, the disclosure of which is incorporated herein in its entirety by reference.

TECHNICAL FIELD

The present disclosure relates to the field of touch technology, and in particular to a touch module, touch display substrate and touch display device.

BACKGROUND

A conductive grid may be used to make touch electrodes in a display device. However, if the conductive grid is unevenly distributed in the touch area, the light transmittance of an entire touch module will be inconsistent, which will deteriorate the display effect of the display device provided with the touch module.

SUMMARY

A touch module is provided according to some embodiments of the present disclosure, including: a base substrate, and a conductive grid layer and a bridging pattern disposed on the base substrate; where the conductive grid layer covers the entire touch area on the base substrate, the conductive grid layer includes a plurality of first touch electrodes and a plurality of second touch electrodes, the first touch electrodes and the second touch electrodes are arranged crosswise and insulated from each other, each of the first touch electrodes includes a plurality of connected first sub-electrodes, and each of the second touch electrodes includes a plurality of independent second sub-electrodes; each of the first sub-electrodes and the second sub-electrodes includes a plurality of grids connected to each other, and the grids are formed by a plurality of crossed conductive lines; the bridging pattern and the conductive grid layer are arranged in different layers; and adjacent second sub-electrodes belonging to the same second touch electrode are connected through the bridging pattern.

In some embodiments, in the mutually crosswise arranged first and second touch electrodes, the conductive lines of the grids on a boundary line between adjacent first and second sub-electrodes are disconnected so that the mutually crosswise arranged first and second touch electrodes are insulated from each other, where the boundary line between adjacent first and second sub-electrodes is formed by an imaginary line connecting break points of the grids on the boundary line.

In some embodiments, the boundary line between adjacent first and second sub-electrodes is formed as a zigzag line.

In some embodiments, an extension direction of the boundary line crosses both an extension direction of the first touch electrodes and an extension direction of the second touch electrodes.

In some embodiments, the bridging pattern includes at least one grid pattern, and each of the at least one grid pattern includes at least one grid connected to each other, an orthographic projection, on the base substrate, of a region of the bridging pattern where the at least one grid pattern is located overlaps with orthographic projections, on the base substrate, of some of the grids on the conductive grid layer.

In some embodiments, each of the bridging patterns is connected to the second sub-electrodes through a plurality of contact holes, and a plurality of contact holes corresponding to the same bridging pattern are connected through conductive lines configured to form grids.

In some embodiments, orthographic projections, on the base substrate, of the plurality of contact holes overlap with orthographic projections, on the base substrate, of the second sub-electrodes.

In some embodiments, the conductive grid layer further includes: a dummy pattern, provided in the first sub-electrodes and/or the second sub-electrodes, the first sub-electrodes and/or the second sub-electrodes are insulated from the dummy pattern provided in the first sub-electrodes and/or the second sub-electrodes.

In some embodiments, at least one dummy pattern is provided in each of the first sub-electrodes and the second sub-electrodes, and a shape, size, corresponding position of the dummy pattern provided in each of the first sub-electrodes and the second sub-electrodes are substantially the same.

In some embodiments, the first sub-electrodes and the second sub-electrodes are substantially rhombic, and the shape of the dummy pattern is substantially the same as the shape of the first sub-electrodes and the second sub-electrodes.

In some embodiments, each of the first sub-electrodes and the second sub-electrodes includes four dummy patterns, the four dummy patterns are provided in two rows and two columns, and each side of the dummy pattern is substantially parallel to a corresponding side of the sub-electrode.

In some embodiments, the dummy pattern is formed by an imaginary line connecting break points of grids at the boundary of the area where the dummy pattern is located.

In some embodiments, the dummy patterns are insulated from each other.

In some embodiments, two adjacent first sub-electrodes of the first touch electrode are connected through a grid connection channel disposed on the same layer as the two adjacent first sub-electrodes; the grid connection channel is disconnected from the second touch electrode.

In some embodiments, the first touch electrodes are disposed along a row direction, and the second touch electrodes are disposed along a column direction. A length of the first touch electrodes in the row direction is less than a length of the second touch electrodes in the column direction.

A touch display substrate including the foregoing touch module is further provided according to some embodiments of the present disclosure.

In some embodiments, the touch display substrate shares a base substrate with the touch module.

In some embodiments, the touch display substrate further includes: a plurality of sub-pixels, where the orthographic projections, on the base substrate, of the sub-pixels are located in areas encircled by orthographic projection regions, on the base substrate, of grids on the conductive grid layer.

In some embodiments, each of the grids corresponds to one of the sub-pixels, and the shape of the grid is the same as the shape of the sub-pixel.

In some embodiments, the size of each of the grids is larger than the size of a light emitting region of the corresponding sub-pixel.

In some embodiments, an orthographic projection, on the base substrate, of the light emitting area of the sub-pixel does not overlap with an orthographic projection, on the base substrate, of the conductive lines.

In some embodiments, the touch display substrate is a flexible organic light emitting diode touch display substrate.

A touch display device including the foregoing touch display substrate is further provided according to some embodiments of the present disclosure.

BRIEF DESCRIPTION OF THE DRAWINGS

To better clarify technical solutions of embodiments of the present disclosure, drawings used in description of the embodiments are briefly introduced hereinafter. Apparently, the described drawings merely illustrate a part of the disclosed embodiments. A person of ordinary skill in the art can obtain other drawings based on the described drawings without any creative efforts.

DETAILED DESCRIPTION

To describe the objective, the technical solutions and the advantages of embodiments of the present disclosure more clearly, the technical solutions in embodiments of the present disclosure are described clearly and completely in conjunction with drawings in the embodiments of the present disclosure. Apparently, the described embodiments are merely a part of rather than all the embodiments of the present disclosure. All other embodiments obtained by a person of ordinary skill in the art based on the described embodiments of the present disclosure fall within the scope of the present disclosure.

Figure 1:
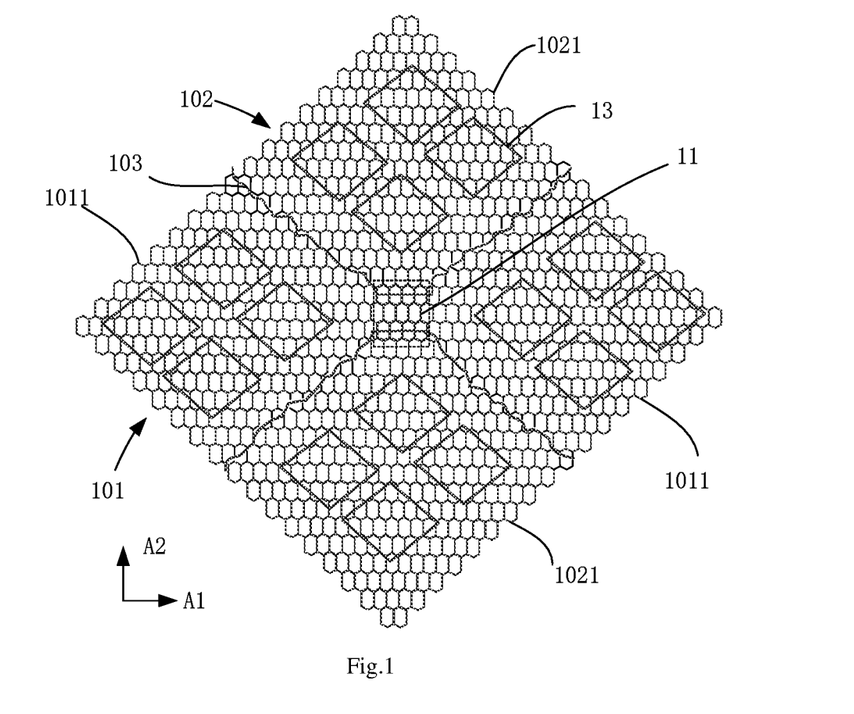
FIG. 1 is a schematic structural diagram of a touch module according to some embodiments of the present disclosure.

Referring to FIG. 1, a touch module is provided according to some embodiments of the present disclosure. The touch module includes: a base substrate, and a conductive grid layer and a bridging pattern 11 disposed on the base substrate.

Figure 19:
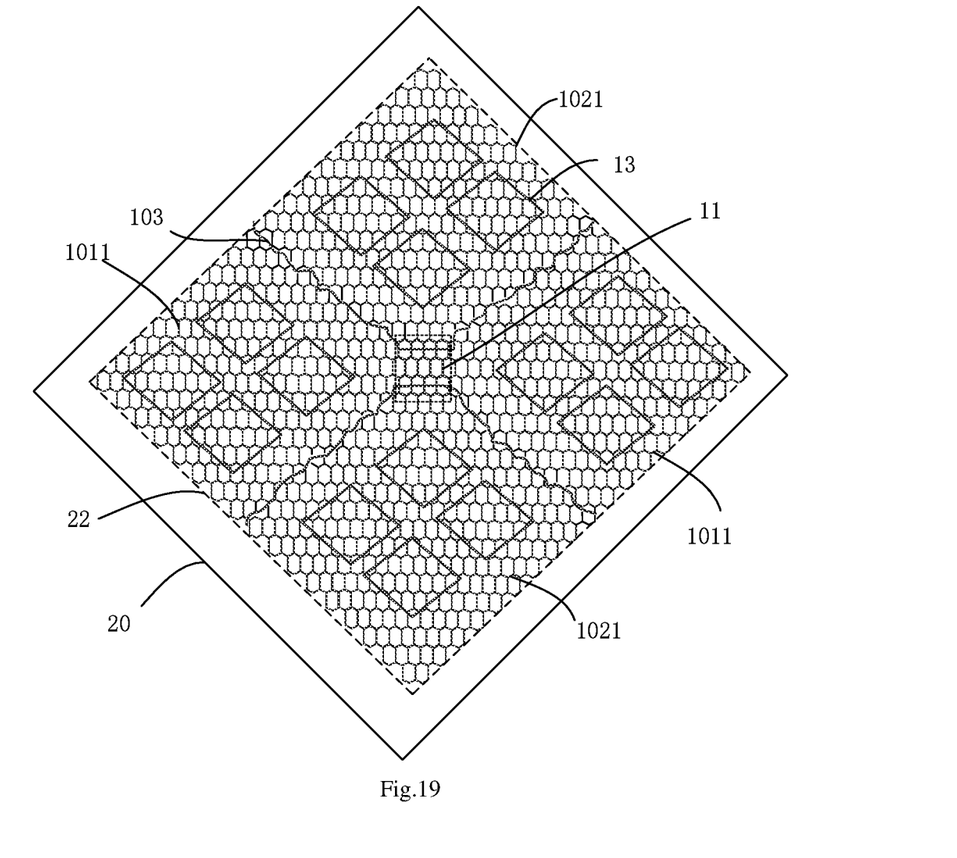
FIG. 19 is a schematic structural diagram of the touch module according to some embodiments of the present disclosure.

The conductive grid layer covers the entire touch area on the base substrate (for example, the conductive grid layer covers the entire touch area 22 on the base substrate 20, as shown in FIG. 19). The conductive grid layer includes: a plurality of first touch electrodes 101 and a plurality of second touch electrodes 102. The first touch electrodes 101 and the second touch electrodes 102 are arranged crosswise and insulated from each other, each of the first touch electrodes 101 includes a plurality of connected first sub-electrodes 1011, and each of the second touch electrodes 102 includes a plurality of independent second sub-electrodes 1021; each of the first sub-electrodes 1011 and the second sub-electrodes 1021 includes a plurality of grids connected to each other, and the grids are formed by a plurality of conductive lines. In some embodiments, the plurality of grids are of the same size and arranged in an array.

The bridging pattern 11 (grid pattern with thicker lines in FIG. 1) and the conductive grid layer are arranged in different layers, and the bridging pattern 11 is used to connect adjacent second sub-electrodes 1021 belonging to the same second touch electrode 102.

In the embodiments of the present disclosure, the touch electrodes are made of a conductive grid layer, and the conductive grid layer covers the entire touch area on the base substrate, so that the uniformity of light transmittance of the entire touch module can be ensured and the display effect of the display device provided with the touch module can be improved.

In some embodiments of the present disclosure, the conductive grid layer is made from a metal material. Compared with ITO materials, metal materials have better ductility and are less likely to break. Therefore, by using metal grids to make touch electrodes, the bendability of the touch module may be improved, such that the touch module is suitable for a flexible display device.

In the embodiment of the present disclosure, the conductive grid layer may be formed by a photolithography process.

In the embodiment as shown in FIG. 1, the first sub-electrodes 1011 and the second sub-electrodes 1021 are substantially rhombic, respectively. Certainly, in other embodiments of the present disclosure, the first sub-electrodes 1011 and the second sub-electrodes 1021 may have other shapes. For example, the first sub-electrodes 1011 and the second sub-electrodes 1021 are substantially rectangular, respectively; or the first sub-electrodes 1011 and the second sub-electrodes 1021 are substantially square, respectively.

Figure 2:
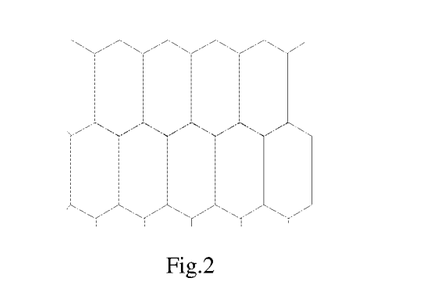
FIG. 2 is a schematic structural diagram of a conductive grid layer according to some embodiments of the present disclosure.
Figure 3:
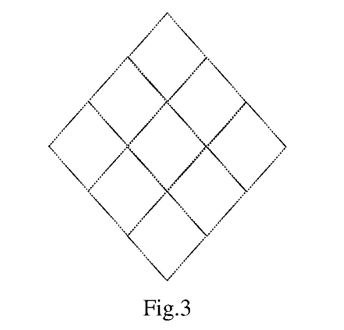
FIG. 3 is a schematic structural diagram of a conductive grid layer according to some embodiments of the present disclosure.
Figure 4:
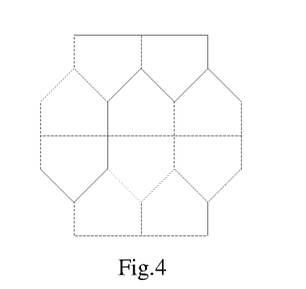
FIG. 4 is a schematic structural diagram of a conductive grid layer according to some embodiments of the present disclosure.
Figure 5:
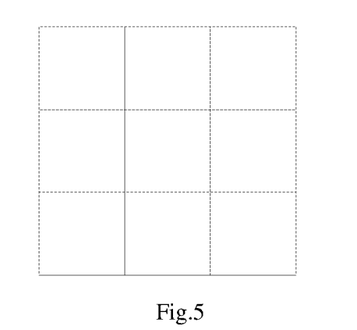
FIG. 5 is a schematic structural diagram of a conductive grid layer according to some embodiments of the present disclosure.

Referring to FIG. 2 simultaneously, the grids in the embodiments of the present disclosure is hexagonal. Certainly, in some other embodiments of the present disclosure, the grids may also have other shapes, such as rhombus, as shown in FIG. 3, or, other patterns, as shown in FIG. 4 and FIG. 5. In some embodiments, the shape of the grids is the same as the shape of the sub-pixels on the display device to which the touch module of the embodiments of the present disclosure is applied, so that the aperture ratio of the display device can be increased as much as possible.

Figure 6:
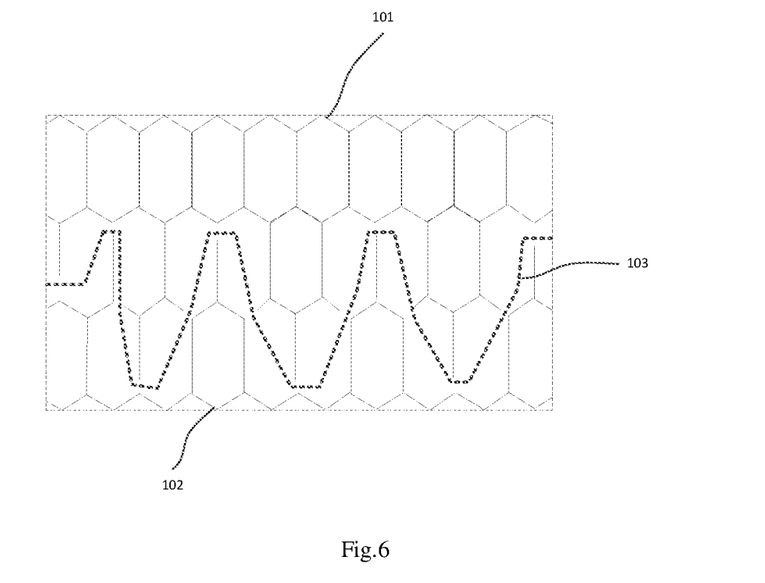
FIG. 6 is a schematic diagram of a boundary line between the first and second sub-electrodes according to some embodiments of the present disclosure.

Referring to FIG. 6, in the embodiments of the present disclosure, in the mutually crosswise arranged first and second touch electrodes, the conductive lines of the grids on the boundary line 103 between the first sub-electrode 1011 and the second sub-electrode 1021 adjacent to each other are disconnected, so that the mutually crosswise arranged first and second touch electrodes are insulated from each other. The boundary line 103 between the first sub-electrode 1011 and the second sub-electrode 1021 adjacent to each other is formed by an imaginary line connecting break points of grids on the boundary line. The break points of the grids on the boundary line are at least located in two different parallel lines.

According to this structure, area between adjacent first touch electrode 101 and second touch electrode 102 is completely covered with grids, rather than being empty, so that the uniformity of light transmittance of the entire touch module can be ensured, and the display effect of a display device incorporating the touch module is improved.

In some embodiments of the present disclosure, referring to FIG. 6, the boundary line between adjacent first sub-electrode 1011 and second sub-electrode 1021 is formed as a zigzag line. The boundary line of the zigzag line shape can increase the length of the boundary line between the first touch electrode 101 and the second touch electrode 102, so as to increase the relative area between the first touch electrode 101 and the second touch electrode 102, thereby increasing the coupling capacitance between the first touch electrode and the second touch electrode, increasing the amount of capacitance change caused by touch, and as a result improving touch performance.

In the embodiment as shown in FIG. 1, the extension direction of the first touch electrode 101 is a row direction (a direction as shown by arrow A1 in FIG. 1), the extension direction of the second touch electrode 102 is a column direction (a direction as shown by arrow A2 in FIG. 1). Certainly, in some other embodiments of the present disclosure, the extension direction of the first touch electrode 101 may be a column direction, and the extension direction of the second touch electrode 102 may be a row direction.

Figure 7:
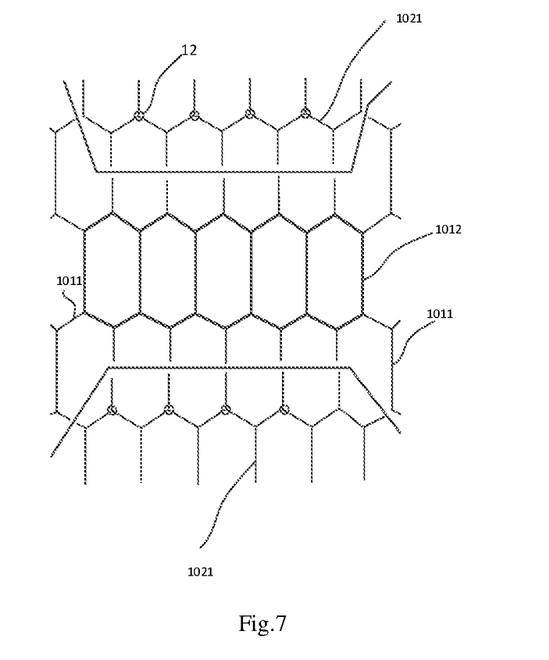
FIG. 7 is a schematic diagram of two adjacent second sub-electrodes according to some embodiments of the present disclosure.
Figure 8:
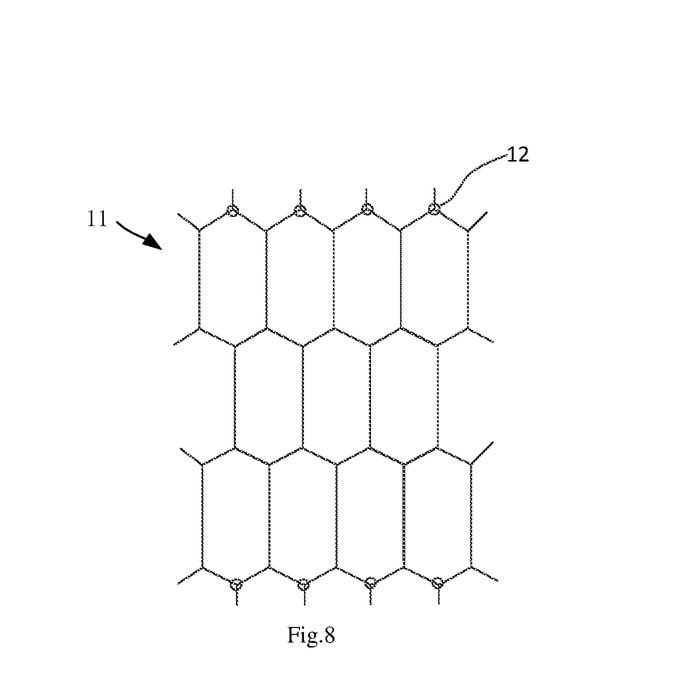
FIG. 8 is a schematic diagram of a bridging pattern according to some embodiments of the present disclosure.
Figure 9:
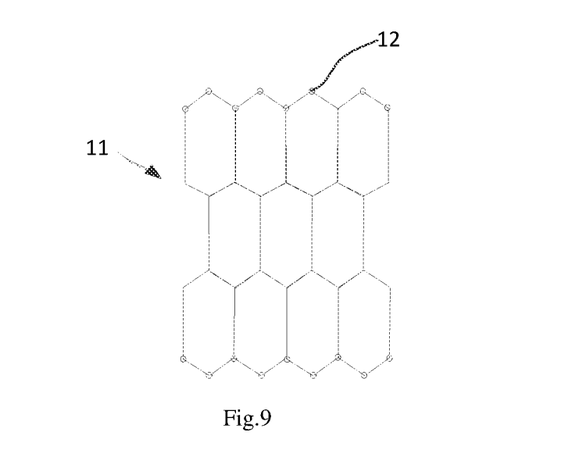
FIG. 9 is a schematic diagram of a bridging pattern according to some embodiments of the present disclosure.
Figure 10:
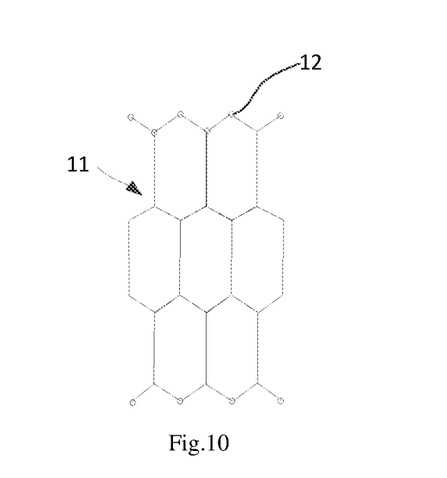
FIG. 10 is a schematic diagram of a bridging pattern according to some embodiments of the present disclosure.
Figure 11:
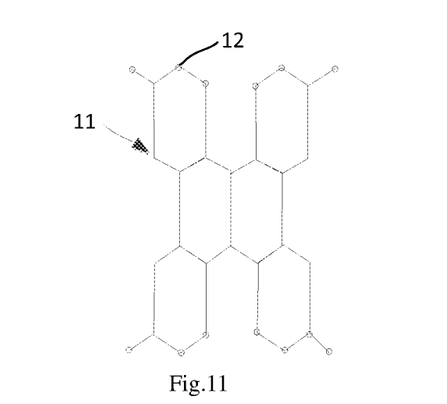
FIG. 11 is a schematic diagram of a bridging pattern according to some embodiments of the present disclosure.

In the embodiment as shown in FIG. 1, two adjacent first sub-electrodes 1011 of the first touch electrode 101 are connected by a grid connection channel disposed on the same layer as the two adjacent first sub-electrodes 1011, and two adjacent second sub-electrodes 1021 of the second touch electrode 102 are not connected on the layer where the two adjacent second sub-electrodes 1021 are located. Referring to FIG. 7 simultaneously, an enlarged schematic diagram of the grids within a dotted box in FIG. 1 is illustrated. As can be seen from FIG. 7, the two adjacent first sub-electrodes 1011 of the first touch electrode 101 are connected by a grid connection channel 1012 (a range of the grid connection channel 1012 is denoted with bold lines) disposed on the same layer as the two adjacent first sub-electrodes 1011; while the two adjacent second sub-electrodes 1021 of the second touch electrode 102 are not connected on the layer where the two adjacent second sub-electrodes 1021 are located, and are disconnected from the grid connection channel 1012 of the first touch electrode 101. The two adjacent second sub-electrodes 1021 of the second touch electrode 102 are connected by a bridging pattern 11 disposed in a different layer from the two adjacent second sub-electrodes 1021.

Referring to FIG. 8 to FIG. 14, in the embodiments of the present disclosure, the bridging pattern 11 includes at least one grid pattern, and each of the grid patterns includes a plurality of grids connected to each other. An orthographic projection, on the base substrate, of a region of the bridging pattern 11 where the grid pattern is located overlaps with orthographic projections, on the base substrate, of some of the grids on the conductive grid layer, so as not to affect the light transmittance of the touch module. Here, it should be noted that the region of the bridging pattern 11 where the grid pattern is located includes conductive lines that cross each other to form the grids and blank areas inside the grids.

Figure 12:
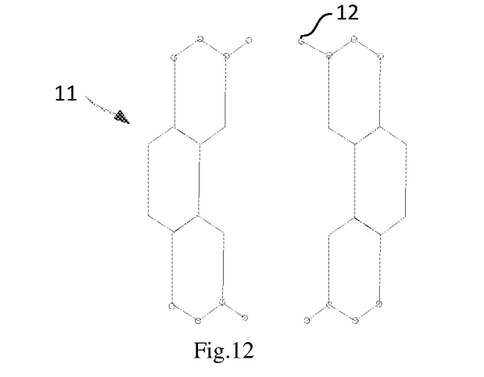
FIG. 12 is a schematic diagram of a bridging pattern according to some embodiments of the present disclosure.
Figure 13:
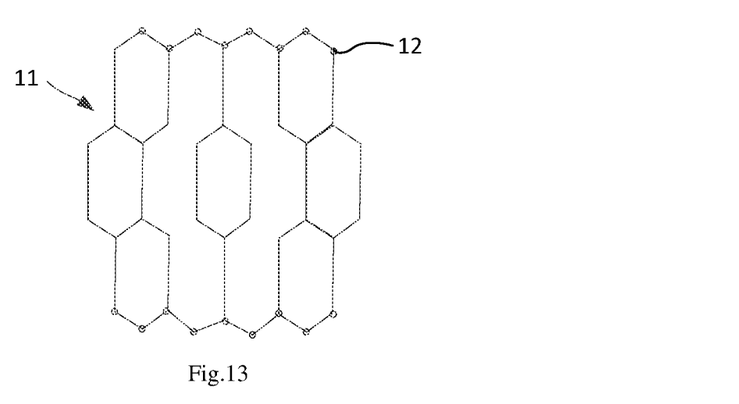
FIG. 13 is a schematic diagram of a bridging pattern according to some embodiments of the present disclosure.
Figure 14:
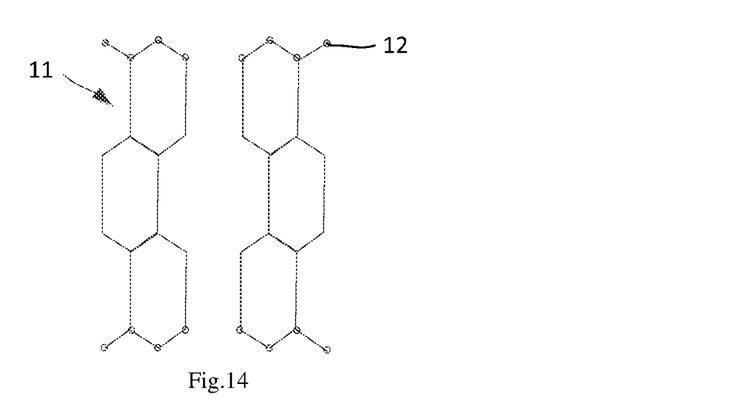
FIG. 14 is a schematic diagram of a bridging pattern according to some embodiments of the present disclosure.

In the embodiments of the present disclosure, each pair of adjacent and interconnected second sub-electrodes 1021 corresponds to a bridging pattern 11. In some embodiments, referring to FIG. 8 to FIG. 14, each of the bridging patterns 11 is connected to the second sub-electrodes 1021 through a plurality of (at least three) contact holes 12. In some embodiments, referring to FIG. 8 to FIG. 11 and FIG. 13, the plurality of contact holes 12 corresponding to the same bridging pattern are connected by conductive lines configured to form grids. In the embodiments of the present disclosure, a bridging pattern may include a single grid pattern, referring to FIG. 8 to FIG. 11 and FIG. 13. At this time, the plurality of contact holes 12 belonging to the same bridging pattern are connected through conductive lines configured to form grids. Certainly, a bridging pattern may include multiple grid patterns as well. As shown in FIG. 12 and FIG. 14, the plurality of contact holes 12 belonging to the same grid pattern are connected by conductive lines configured to form grids. In the embodiments of the present disclosure, the bridging pattern 11 is connected to the second sub-electrodes 1021 through a plurality of contact holes 12, and a plurality of contact holes 12 belonging to the same bridging pattern 11 or the same grid pattern of the same bridging pattern 11 are connected by conductive lines configured to form grids, such that even if individual contact hole 12 or grid pattern is not properly fabricated, the overall touch performance is not impacted.

Figure 15:
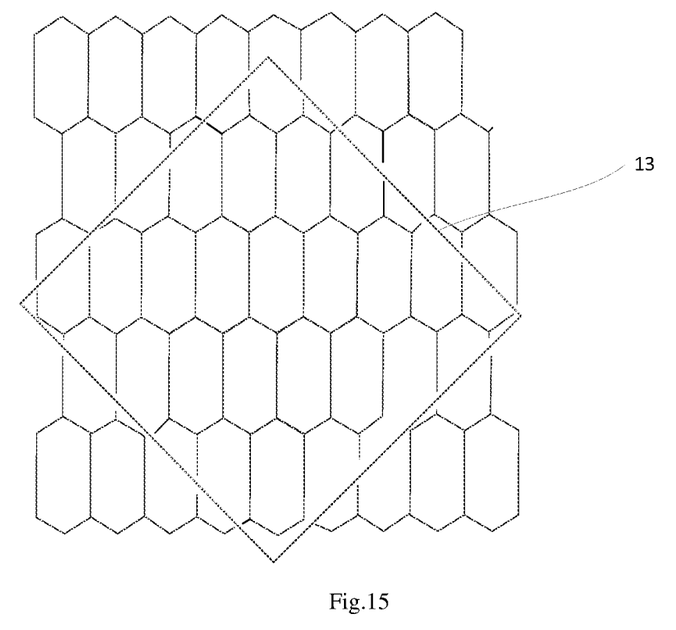
FIG. 15 is a schematic diagram of a dummy pattern according to some embodiments of the present disclosure.
Figure 16:
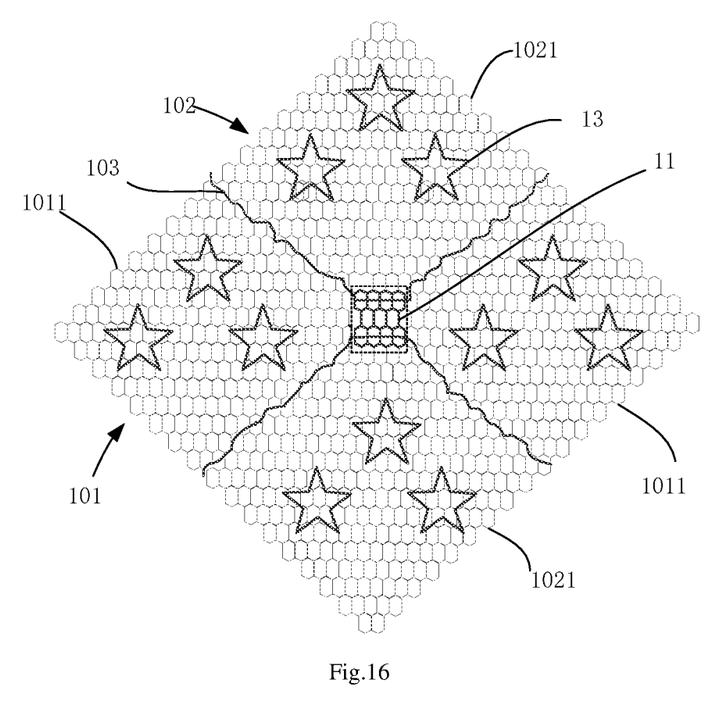
FIG. 16 is a schematic structural diagram of the touch module according to some embodiments of the present disclosure.

In some embodiments of the present disclosure, referring to FIG. 1, FIG. 15 and FIG. 16, the conductive grid layer may further include a dummy pattern 13. The dummy pattern 13 is provided in the first sub-electrode 1011 and/or the second sub-electrode 1021, and is insulated from the sub-electrode (the first sub-electrode 1011 or the second sub-electrode 1021) in the area where the dummy pattern 13 is located. That is, the conductive lines of the grids in a boundary region (a dotted box in FIG. 15) between the dummy pattern 13 and the sub-electrode in the area where the dummy pattern 13 is located are disconnected. In the embodiments of the present disclosure, the dummy pattern 13 may have various shapes, such as a rhombus, or a pentagram. In some embodiments, each sub-electrode includes a dummy pattern 13, and there may be one or more dummy patterns 13 on each sub-electrode. In some embodiments, at least one dummy pattern is provided in each of the first sub-electrodes and the second sub-electrodes, and a shape, size, and corresponding position of the dummy pattern provided in each of the first sub-electrodes and the second sub-electrodes are substantially the same. The corresponding position mentioned here refers to a relative position of the dummy pattern in the sub-electrode (first sub-electrode and second sub-electrode) area. In some embodiments, the first sub-electrodes and the second sub-electrodes are substantially rhombic, and the shape of the dummy pattern is the same as the shape of the first sub-electrodes and the second sub-electrodes. In some embodiments, each of the first sub-electrodes and the second sub-electrodes includes four dummy patterns. The four dummy patterns are arranged in two rows and two columns, and each side of the dummy pattern is parallel to corresponding side of the sub-electrode.

In the embodiments of the present disclosure, by cutting the dummy pattern 13 in the sub-electrode, an area of the touch electrode may be reduced, thereby optimizing the capacitance of the touch electrode. At the same time, since the dummy pattern 13 is formed by an imaginary line connecting break points of the grids in the sub-electrode in the area of the dummy pattern 13, the uniformity of light transmittance of the entire touch module may be ensured, thereby improving the display effect of the display device provided with the touch module.

Figure 20:
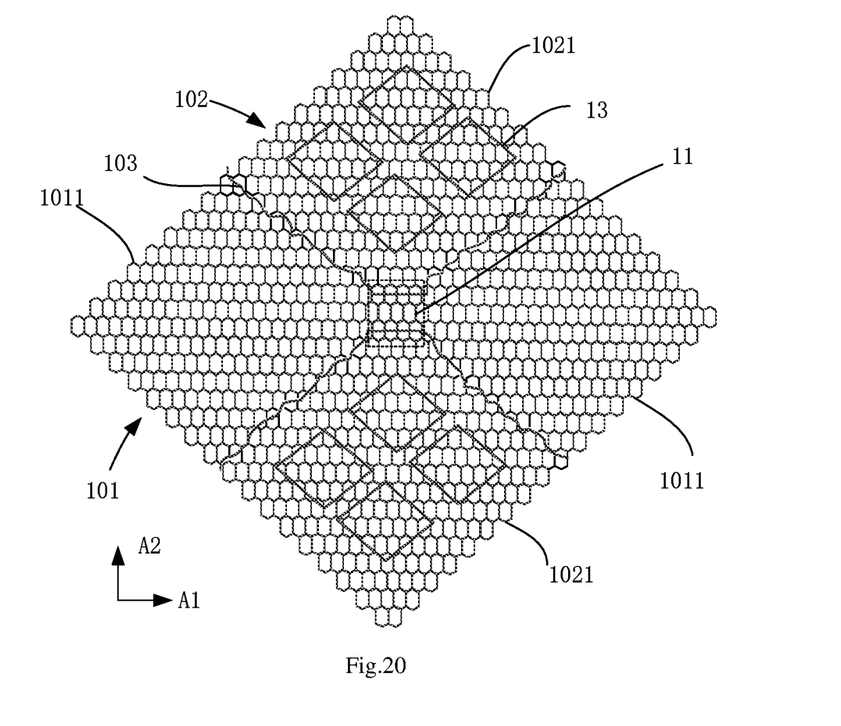
FIG. 20 is a schematic diagram of a dummy pattern according to some embodiments of the present disclosure.

In some embodiments of the present disclosure, referring to FIG. 20, optionally, there is no dummy pattern in the first sub-electrode 1011, and there is at least one dummy pattern 13 in the second sub-electrode 1021. In general, a longitudinal length of a touch panel is greater than a transversal length of the touch panel, as a result, the second touch electrode extending in the longitudinal direction experience a greater load. Therefore, the dummy pattern provided in the second sub-electrode may reduce self-capacitance of the second touch electrode, so that loads on the first touch electrodes and the second touch electrodes may be substantially balanced.

The touch module in the embodiments of the present disclosure may be manufactured independently, and be attached onto the display substrate after the manufacturing is completed.

In some other embodiments of the present disclosure, the touch module may be integrated on the display substrate.

The present disclosure further provides a touch display substrate including the touch module according to any one of the foregoing embodiments.

In the embodiments of the present disclosure, the touch electrode is made of a conductive grid layer, and the conductive grid layer covers the entire touch area on the base substrate, so that the uniformity of light transmittance of the entire touch display substrate can be ensured, thereby improving the display effect of a display device having the touch display substrate.

In some embodiments of the present disclosure, the conductive grid layer is made from a metal material, and the touch electrode is made of a metal grid. Compared with ITO materials, metal materials have better ductility and are less likely to break. Thus, by using metal grids to make touch electrodes, the bendability of the touch display substrate may be improved, such that the touch display substrate is suitable for a flexible display device.

In some embodiments, the touch display substrate shares a base substrate with the touch module.

In the embodiments of the present disclosure, the touch module is integrated on the display substrate, and a conventional externally-attached touch screen is eliminated, which can reduce the thickness of the touch display device having the touch display substrate, and is beneficial to realize an ultra-thin display. At the same time, the touch module and the display substrate share a single base substrate, such that one base substrate is dispensed with, which improves the light output effect while reducing the thickness.

The touch display substrate in the embodiments of the present disclosure may be a display substrate applied to a liquid crystal display device, a display substrate applied to an organic light emitting diode display device, or a display substrate applied to other types of display devices. When the touch display substrate is a display substrate applied to a liquid crystal display device, the display substrate may be a color filter substrate, and the conductive grid layer in the touch module may be disposed on a light emitting side of a base substrate of the color filter substrate. When the touch display substrate is a display substrate applied to an organic light emitting diode display device, the conductive grid layer in the touch module may be located on the encapsulation layer of the organic light emitting diodes.

Figure 17:
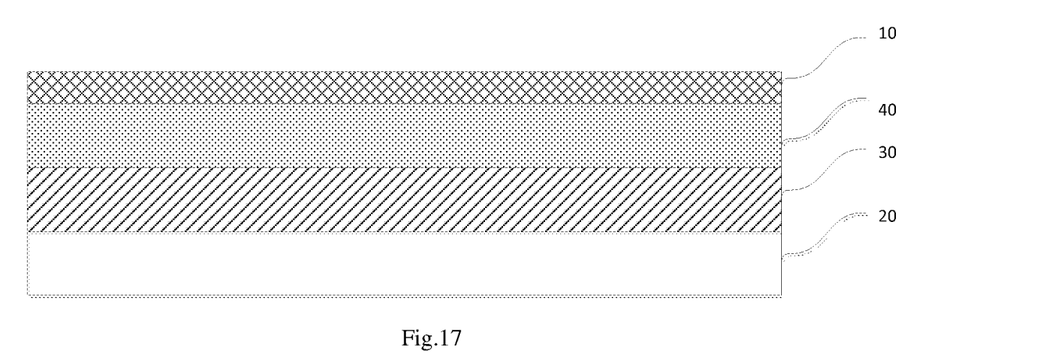
FIG. 17 is a schematic structural diagram of a touch display substrate according to some embodiments of the present disclosure.

Referring to FIG. 17, a schematic structural diagram of the touch display substrate according to some embodiments of the present disclosure is illustrated. The touch display substrate includes: a base substrate 20, a light emitting diode device 30 disposed on the base substrate 20, a thin film encapsulation layer 40 for encapsulating the light emitting diode device, and a conductive grid layer 10 disposed on the thin film encapsulation layer 40. For the structure of the conductive grid layer 10, refer to the conductive grid layer in the touch module in the foregoing embodiments, and a description thereof will not be repeated here.

In some embodiments of the present disclosure, the base substrate 20 is a flexible substrate, so that it can be applied to a flexible display device.

The touch display substrate in the embodiments of the present disclosure may further include a plurality of sub-pixels, where orthographic projections, on the base substrate, of the sub-pixels are located within orthographic projection regions, on the base substrate, of the grids on the conductive grid layer, which prevents the occurrence of moiré interference pattern, thereby a normal display will not be impacted.

In some embodiments, each of the grids corresponds to one of the sub-pixels, and the shape of the grid pattern is the same as the shape of the sub-pixels.

Figure 18:
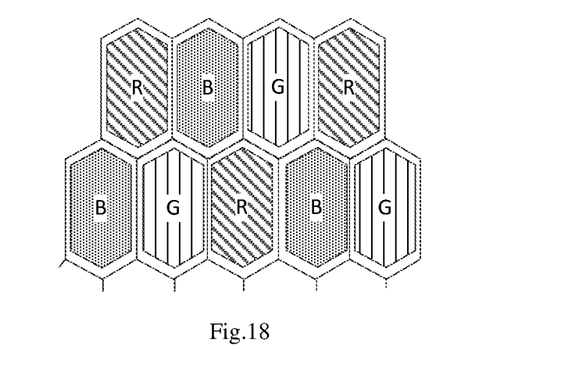
FIG. 18 is a schematic diagram of positional relationship between sub-pixels and conductive grid layer on the touch display substrate according to some embodiments of the present disclosure.

Referring to FIG. 18, in the embodiments as shown in FIG. 18, the touch display substrate includes sub-pixels of three colors, which are red sub-pixel (R), green sub-pixel (G), and blue sub-pixel (B). The shape of the sub-pixels is the same as the shape of the grid, namely, hexagon. Orthographic projections, on the base substrate, of the sub-pixels are located within orthographic projection regions, on the base substrate, of the grids. Here, it should be noted that a sub-pixel includes a light-emitting region and a non-light-emitting region (such as a region where a driving structure is located). Here, the orthographic projections, on the base substrate, of the sub-pixels being located within the orthographic projection regions, on the base substrate, of the grids refers to that an orthographic projection, on the base substrate, of a light-emitting area of a sub-pixel is located within an orthographic projection region, on the base substrate, of a blank area inside a grid, and the orthographic projections, on the base substrate, of the light-emitting areas of the sub-pixels do not overlap with the orthographic projections, on the base substrate, of the conductive lines.

Figure 21:
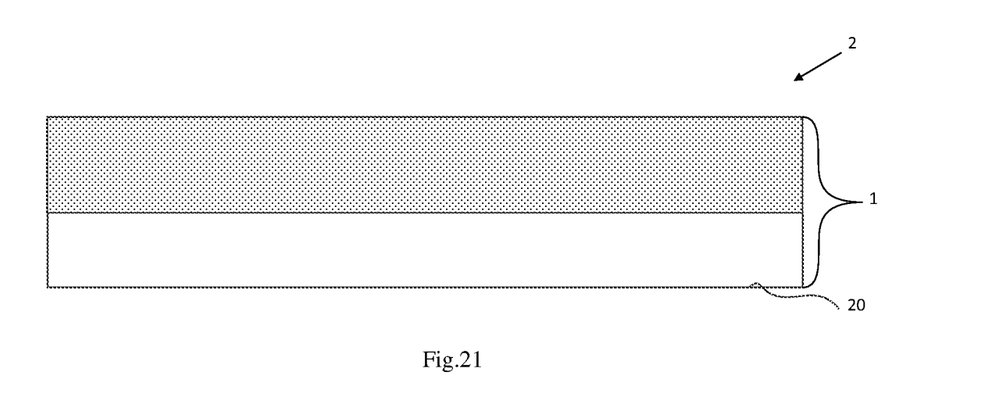
FIG. 21 is a schematic structural diagram of a touch display substrate according to some embodiments of the present disclosure.

Referring to FIG. 21, a schematic structural diagram of a touch display substrate according to some embodiments of the present disclosure is illustrated. The touch display substrate 2 includes a touch module 1. The touch display substrate 2 shares a base substrate 20 with the touch module 1.

Figure 22:
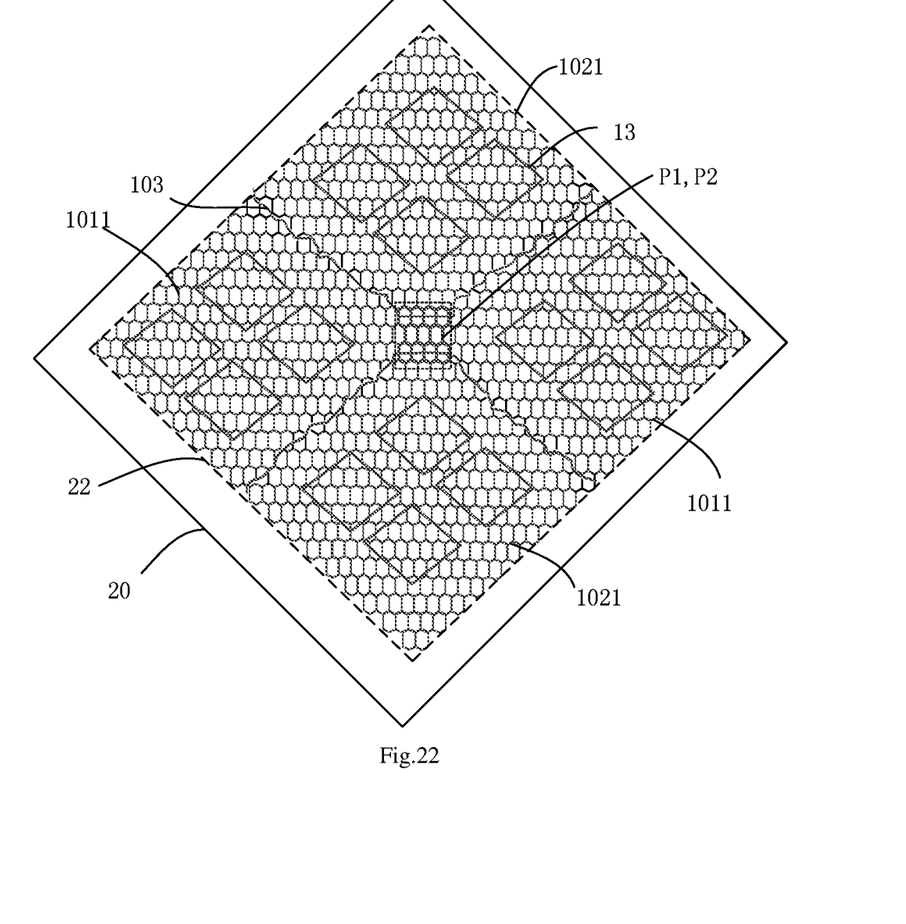
FIG. 22 is a schematic structural diagram of the touch module according to some embodiments of the present disclosure, in which an orthographic projection P2 of a region of the bridging pattern and orthographic projections P1 of some of the grids on the conductive grid layer are illustrated.

Referring to FIG. 22, a schematic structural diagram of the touch module according to some embodiments of the present disclosure is illustrated, in which an orthographic projection P2 of a region of the bridging pattern and orthographic projections P1 of some of the grids on the conductive grid layer are shown, and the overlapped orthographic projections are denoted with bold lines.

Figure 23:
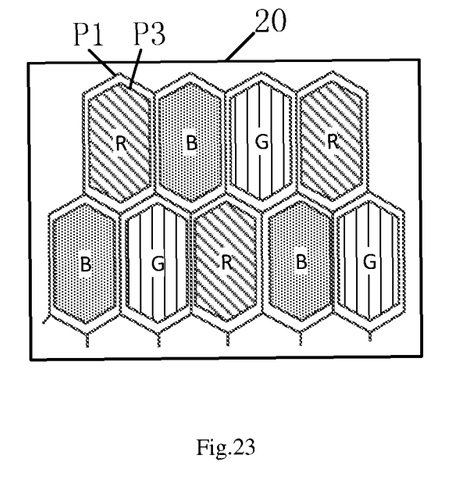
FIG. 23 is a schematic diagram of positional relationship between sub-pixels and conductive grid layer on the touch display substrate according to some embodiments of the present disclosure, in which the orthographic projections P3 of the sub-pixels and the orthographic projection regions P1 of the grids are illustrated.

Referring to FIG. 23, a schematic diagram of positional relationship between sub-pixels and conductive grid layer on the touch display substrate according to some embodiments of the present disclosure is illustrated, in which the orthographic projections P3 of the sub-pixels and the orthographic projection regions P1 of the grids are shown.

An embodiment of the present disclosure further provides a touch display device including the touch display substrate according to any one of the foregoing embodiments.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. Expressions such as "connection" or "connected" are not limited to denote physical or mechanical connections, but may include electrical connections, whether direct or indirect. "Up", "down", "left", "right", etc. are only used to indicate the relative position relationship. When the absolute position of the described object changes, the relative position relationship changes accordingly.

The above descriptions merely describe optional implementations of the present disclosure. It is appreciated, modifications and improvements may be made by a person of ordinary skill in the art without departing from the principle of the present disclosure, and these modifications and improvements shall fall within the scope of the present disclosure.

What is claimed is:

1. A touch module, comprising:
    a base substrate;
    a conductive grid layer and a bridging pattern disposed on the base substrate;
    wherein the conductive grid layer covers an entire touch area on the base substrate, the conductive grid layer comprises a plurality of first touch electrodes and a plurality of second touch electrodes, the first touch electrodes and the second touch electrodes are arranged crosswise and insulated from each other, each of the first touch electrodes comprises a plurality of connected first sub-electrodes, and each of the second touch electrodes comprises a plurality of independent second sub-electrodes;
    wherein each of the first sub-electrodes and the second sub-electrodes comprises a plurality of grids connected to each other, and the grids are formed by a plurality of crossed conductive lines;
    wherein the bridging pattern and the conductive grid layer are arranged in different layers, and adjacent second sub-electrodes belonging to a same second touch electrode are connected through the bridging pattern; and
    wherein the bridging pattern comprises at least one grid pattern, each of the at least one grid pattern comprises a plurality of grids connected to each other, and an orthographic projection, on the base substrate, of a region of the bridging pattern where the at least one grid pattern is located overlaps with orthographic projections, on the base substrate, of some of the grids on the conductive grid layer.

2. The touch module according to claim 1, wherein in the crosswise arranged first and second touch electrodes, the conductive lines of the grids on a boundary line between adjacent first and second sub-electrodes are disconnected so that the crosswise arranged first and second touch electrodes are insulated from each other, wherein the boundary line between the adjacent first and second sub-electrodes is formed by an imaginary line connecting break points of the grids on the boundary line.

3. The touch module according to claim 2, wherein the boundary line between the adjacent first and second sub-electrodes is formed as a zigzag line.

4. The touch module according to claim 2, wherein an extension direction of the boundary line crosses both an extension direction of the first touch electrodes and an extension direction of the second touch electrodes.

5. The touch module according to claim 2, wherein the grids of the touch electrodes are hexagonal, and the break points of the grids on the boundary line are at least located in two different parallel lines.

6. The touch module according to claim 1, wherein the conductive grid layer further comprises a dummy pattern, wherein
    the dummy pattern is provided on the first sub-electrodes or the second sub-electrodes, wherein the first sub-electrodes or the second sub-electrodes are insulated from the dummy pattern provided on the first sub-electrodes or the second sub-electrodes; or
    the dummy pattern is provided on the first sub-electrodes and the second sub-electrodes, wherein the first sub-electrodes and the second sub-electrodes are insulated from the dummy pattern provided on the first sub-electrodes and the second sub-electrodes.

7. The touch module according to claim 6, wherein there is no dummy pattern on the first sub-electrodes, and there is at least one dummy pattern on the second sub-electrodes.

8. The touch module according to claim 7, wherein the first touch electrodes are disposed along a row direction, the second touch electrodes are disposed along a column direction, and a length of the first touch electrodes in the row direction is less than a length of the second touch electrodes in the column direction.

9. The touch module according to claim 6, wherein the dummy pattern is provided on the first sub-electrodes and the second sub-electrodes, with at least one dummy pattern being provided on each of the first sub-electrodes and the second sub-electrodes, and wherein a shape, size, and corresponding position of the dummy pattern provided on each of the first sub-electrodes and the second sub-electrodes are substantially the same.

10. The touch module according to claim 9, wherein the first sub-electrodes and the second sub-electrodes are substantially rhombic, and the shape of the dummy pattern is substantially the same as the shape of the first sub-electrodes and the second sub-electrodes.

11. The touch module according to claim 1, wherein the bridging pattern is connected to the second sub-electrodes through a plurality of contact holes, and the plurality of contact holes are connected through conductive lines configured to form grids.

12. The touch module according to claim 11, wherein orthographic projections, on the base substrate, of the plurality of contact holes overlap with orthographic projections, on the base substrate, of the second sub-electrodes.

13. The touch module according to claim 1, wherein two adjacent first sub-electrodes of the first touch electrode are connected through a grid connection channel disposed on the same layer as the two adjacent first sub-electrodes, and the grid connection channel is disconnected from the second touch electrode.

14. A touch display substrate, comprising the touch module according to claim 1.

15. The touch display substrate according to claim 14, wherein a light emitting diode device is disposed on the base substrate, an encapsulation layer is provided for encapsulating the light emitting diode device, and the conductive grid layer is disposed on the encapsulation layer.

16. The touch display substrate according to claim 14, further comprising:
a plurality of sub-pixels, wherein orthographic projections, on the base substrate, of the sub-pixels are located within areas encircled by orthographic projection regions, on the base substrate, of the grids of the conductive grid layer.

17. The touch display substrate according to claim 16, wherein each of the grids corresponds to one of the sub-pixels, and a shape of a respective grid is the same as a shape of a corresponding sub-pixel.

18. The touch display substrate according to claim 17, wherein an orthographic projection, on the base substrate, of the light emitting area of the sub-pixel does not overlap with an orthographic projection, on the base substrate, of the conductive lines.

19. A touch display device, comprising the touch display substrate according to claim 14.

* * * * *